US008952705B2

(12) United States Patent
Elkin et al.

(10) Patent No.: US 8,952,705 B2
(45) Date of Patent: Feb. 10, 2015

(54) SYSTEM AND METHOD FOR EXAMINING ASYMETRIC OPERATIONS

(75) Inventors: Ilyas Elkin, Sunnyvale, CA (US); Wojciech Jakub Poppe, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 258 days.

(21) Appl. No.: 13/287,053

(22) Filed: Nov. 1, 2011

(65) Prior Publication Data
US 2013/0106438 A1 May 2, 2013

(51) Int. Cl.
G01R 27/28 (2006.01)
G01R 31/30 (2006.01)
G01R 31/28 (2006.01)

(52) U.S. Cl.
CPC ........ G01R 31/2882 (2013.01); G01R 31/3016 (2013.01)
USPC ............................... 324/617; 327/2; 327/172

(58) Field of Classification Search
USPC ......... 324/617, 765, 768; 326/95, 114; 327/2, 327/172; 365/194; 331/51
See application file for complete search history.

(56) References Cited

U.S. PATENT DOCUMENTS

| | | | |
|---|---|---|---|
| 4,922,140 A | | 5/1990 | Gahle et al. |
| 5,553,276 A | * | 9/1996 | Dean ............................. 713/500 |
| 5,835,553 A | * | 11/1998 | Suzuki ............................. 377/25 |
| 5,973,507 A | * | 10/1999 | Yamazaki ....................... 326/52 |
| 6,023,430 A | * | 2/2000 | Izumikawa .................... 365/194 |
| 6,242,960 B1 | * | 6/2001 | Bae ................................ 327/299 |
| 6,401,018 B1 | | 6/2002 | Oba et al. |
| 6,535,013 B2 | * | 3/2003 | Samaan ....................... 324/750.3 |

(Continued)

FOREIGN PATENT DOCUMENTS

| | | |
|---|---|---|
| CN | 102098028 A | 6/2011 |
| DE | 102006005848 A1 | 8/2006 |

(Continued)

OTHER PUBLICATIONS

Basab Datta et al., "Analysis of a Ring Oscillator Based on Chip Thermal Sensor in 65nm Technology", VLSI Design Principles (ECE 658) Lab 4 Project, University of Massachusetts-Amherst, Dec. 23, 2005.

(Continued)

Primary Examiner — Arleen M Vazquez
Assistant Examiner — Neel Shah

(57) ABSTRACT

Systems and methods for transition delay measuring are presented. A transition delay measuring method can include oscillating a signal between states and tracking an indication associated with an isolated attribute of the transitions between the states. Oscillations can include asymmetric transitions between the states and the tracked isolated attribute can be a delay in completing transitions between the states in one direction or vice versa. The asymmetric transitions can include transitions between the first state and the second state that are faster than slower transitions between the second state and the first state or vice versa. The tracked indication can be utilized in analysis of the isolated transition delay characteristics. The results can be utilized in analysis of various further features and characteristics (e.g., examination of leakage current related power consumption, timing of asymmetric operation, etc.). The analysis can include examination of fabrication process and operating parameters.

20 Claims, 13 Drawing Sheets

(56) References Cited

U.S. PATENT DOCUMENTS

| | | |
|---|---|---|
| 6,535,071 B2 | 3/2003 | Forbes |
| 6,724,225 B2 * | 4/2004 | Joshi et al. ............... 326/113 |
| 6,801,096 B1 | 10/2004 | Nariman et al. |
| 6,854,100 B1 | 2/2005 | Chuang et al. |
| 6,882,172 B1 | 4/2005 | Suzuki et al. |
| 6,998,901 B2 | 2/2006 | Lee |
| 7,085,658 B2 | 8/2006 | Bhushan et al. |
| 7,151,417 B1 | 12/2006 | Suzuki |
| 7,180,794 B2 | 2/2007 | Matsue |
| 7,282,975 B2 | 10/2007 | Burton et al. |
| 7,315,221 B2 | 1/2008 | Ha et al. |
| 7,332,937 B2 * | 2/2008 | Hsu et al. ............... 326/95 |
| 7,365,611 B2 | 4/2008 | Ikeda et al. |
| 7,489,204 B2 | 2/2009 | Habitz et al. |
| 7,550,998 B2 | 6/2009 | Brazis et al. |
| 7,592,876 B2 | 9/2009 | Newman |
| 7,642,864 B2 | 1/2010 | Chuang et al. |
| 7,760,033 B2 | 7/2010 | Podmanik et al. |
| 7,795,927 B2 * | 9/2010 | Farwell ............... 327/34 |
| 7,804,372 B2 | 9/2010 | Nakatani |
| 7,868,706 B2 * | 1/2011 | Nissar et al. ............... 331/57 |
| 7,908,109 B2 | 3/2011 | Good et al. |
| 8,041,518 B2 | 10/2011 | McIntyre et al. |
| 8,081,035 B2 | 12/2011 | Wood |
| 8,143,919 B2 * | 3/2012 | Kurokawa ............... 326/114 |
| 8,193,833 B2 * | 6/2012 | Inukai ............... 326/112 |
| 8,247,906 B2 | 8/2012 | Law et al. |
| 8,378,754 B2 | 2/2013 | Yamamoto |
| 2003/0001185 A1 | 1/2003 | Sell et al. |
| 2003/0034848 A1 | 2/2003 | Norman et al. |
| 2005/0007154 A1 * | 1/2005 | Patella et al. ............... 327/2 |
| 2005/0012556 A1 | 1/2005 | Bhushan et al. |
| 2006/0028241 A1 | 2/2006 | Apostol et al. |
| 2006/0178857 A1 | 8/2006 | Barajas |
| 2007/0273450 A1 | 11/2007 | Burton et al. |
| 2008/0094053 A1 | 4/2008 | Han et al. |
| 2009/0045834 A1 * | 2/2009 | Farwell ............... 326/21 |
| 2009/0096495 A1 | 4/2009 | Keigo |
| 2010/0102891 A1 * | 4/2010 | Nissar et al. ............... 331/57 |
| 2010/0189160 A1 * | 7/2010 | Kim et al. ............... 374/170 |
| 2010/0327983 A1 | 12/2010 | Yamamoto |
| 2013/0021107 A1 | 1/2013 | Poppe et al. |
| 2013/0027140 A1 | 1/2013 | Poppe et al. |
| 2013/0106524 A1 | 5/2013 | Elkin et al. |
| 2013/0110437 A1 | 5/2013 | Singh et al. |

FOREIGN PATENT DOCUMENTS

| | | |
|---|---|---|
| DE | 102004001668 B4 | 9/2007 |
| DE | 10063996 B4 | 6/2009 |
| KR | 10-2001-0035660 A | 5/2001 |
| TW | 200403779 A | 3/2004 |
| TW | 200419688 A | 10/2004 |
| TW | 200943719 A | 10/2009 |
| TW | 201103116 A | 1/2011 |
| TW | 201118392 A | 6/2011 |

OTHER PUBLICATIONS

Klass, Fabian; "Design for Yield Using Statistical Design," EE380 Computer Systems Colloquium, Stanford University, Feb. 7, 2007.

Harshada Vinayak Khare, "Design of an On-Chip Thermal Sensor using Leakage Current of a Transistor", Jan. 2010 Thesis University of Minnesota.

* cited by examiner

1000

1010
Performing a first inversion transition.

1020
Performing a second inversion transition.

1030
A transition completion measurement process associated with the second inversion transition is performed.

1110
The logical value of two inputs are examined.

1120
A logical 0 is output if both of the two inputs are a logical 0 and continuing to output the logical 0 until both inputs are a logical 1..

1130
A logical 1 is output if both of the two inputs are a logical 1 and continuing to output the logical 1 until both inputs are a logical 0.

1210
Performing an inversion process.

1220
Analyzing characteristics of a device based upon a delay associated with the inversion process.

FIGURE 12

SYSTEM AND METHOD FOR EXAMINING ASYMETRIC OPERATIONS

FIELD OF THE INVENTION

The present invention relates to examining operations. In particular, the present invention relates to a system and method for asymmetric delay measuring.

BACKGROUND OF THE INVENTION

Electronic systems and circuits have made a significant contribution towards the advancement of modern society and are utilized in a number of applications to achieve advantageous results. Numerous electronic technologies such as digital computers, calculators, audio devices, video equipment, and telephone systems have facilitated increased productivity and reduced costs in analyzing and communicating data in most areas of business, science, education and entertainment. The manner in which the electronic devices perform operations can have a significant impact on the performance and end results. However, traditional attempts at accurately analyzing impacts associated with different aspects of how a device operates are often limited and can be very complex and complicated.

A variety of things can impact operations of a device (e.g., manufacturing parameters, environment, temperature, etc.). Adequately isolating the impacts of the various features can be very difficult. Electronic devices often include operations that have two aspects of an asymmetric nature that contribute differently to an operation. For example, a time delay associated with a pull up operation and a time delay associated with a pull down operation can be different. The delay to complete the rising transition of the pull up operation can be faster than the delay to complete the falling transition of the pull down operation, or vise versa. However, attempts at detecting and gathering information corresponding to contributions or impacts associated with the delay to complete the pull up rising transitions isolated or distinguishable from information corresponding to contributions or impacts associated with the delay to complete the pull down falling transitions can be very difficult and resource intensive.

SUMMARY

Systems and methods for transition delay measuring are presented. In one embodiment, a transition delay measuring method includes oscillating a signal between a first state and a second state and tracking an indication associated with an isolated attribute of the transitions between the states. The oscillations can include asymmetric transitions between the first state and the second state and the tracked isolated attribute can be a delay in completing transitions between the first state and second state in one direction or vice versa. The asymmetric transitions can include fast transitions that complete a transition between the first state and the second state faster than slower transitions between the second state and the first state or vice versa.

The tracked indication can be utilized in an analysis of the isolated transition delay characteristics. It is also appreciated that the results of the analysis of the transition delay characteristics can be utilized in further analysis of various features and characteristics (e.g., examination of power consumption associated with leakage currents, analysis of timing associated with asymmetric operations, etc.). In one embodiment, the analysis can include reviewing manufacturing or fabrication processes and examining operating parameters.

DESCRIPTION OF THE DRAWINGS

The accompanying drawings, which are incorporated in and form a part of this specification, illustrate embodiments of the invention by way of example and not by way of limitation. The drawings referred to in this specification should be understood as not being drawn to scale except if specifically noted.

FIG. 10 is a block diagram of an exemplary delay measuring method in accordance with one embodiment of the present invention.

FIG. 11 is a block diagram of an exemplary transition completion detection process in accordance with one embodiment of the present invention.

FIG. 12 is a flow chart of an exemplary analysis method in accordance with one embodiment of the present invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

It is appreciated that present systems and methods can be implemented in a variety of situations or environments to facilitate a variety of analyses. In one embodiment, a signal transition delay is measured. The transition delay can correspond to a delay from the initiation of an inversion transition to the completion of the inversion transition. The transition delays can be asymmetric and an amount of time to complete a pull up or rising transition can be different from an amount of time to complete a pull down or falling transition (e.g., fast rising transition versus slow falling transition, vise versa, etc.). The measurement can be associated with an isolated or particular transition direction (e.g., measurement of delay associated with a slow falling transition distinct from delay associated with a fast rising transition, vise versa, etc.). The delays can be introduced by a variety of operations (e.g., delay associated with a regular pull up operation versus with waiting for leakage conditions on a pull down operation, delay associated with a pre-charge operation versus a read operation, etc.). The indication of delay measurements can be utilized in a variety of different analysis (e.g., analyze manufacturing process compliance and defects, leakage current power consumption, etc.). The analysis process can include analyzing a fabrication process and operating parameters based upon the amount of delay time associated with a transition.

Figure 1:
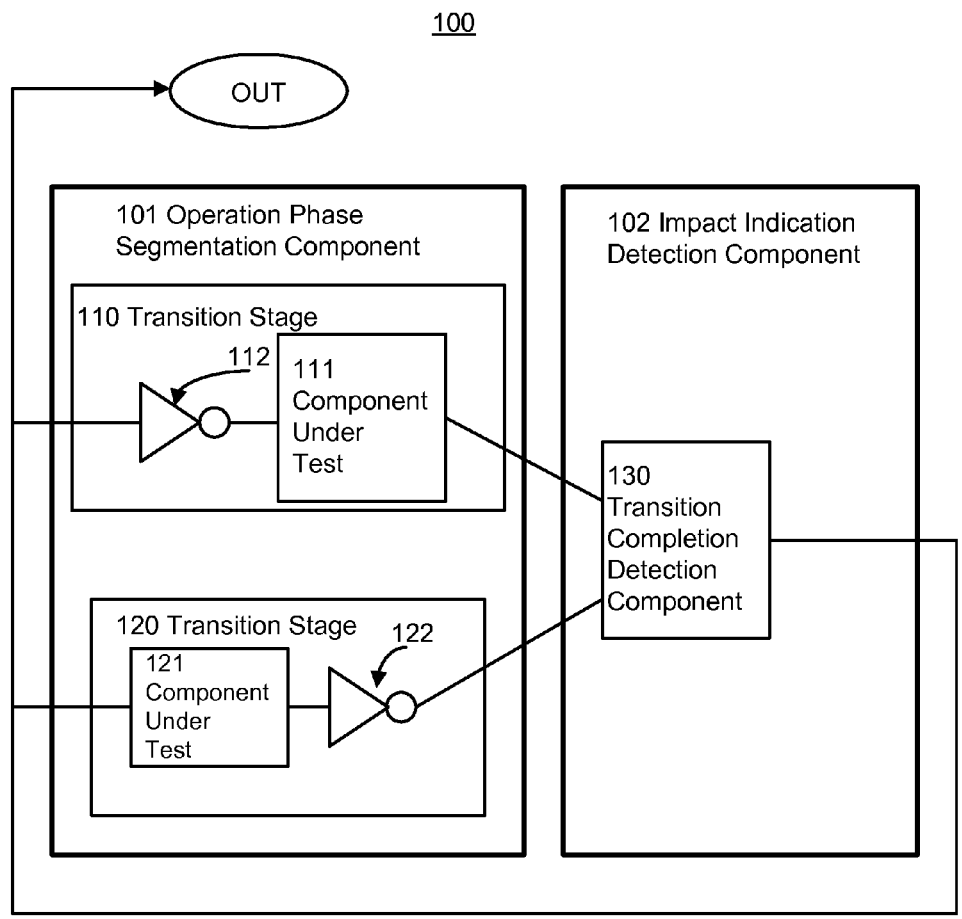
FIG. 1 is a block diagram of an exemplary delay measuring system in accordance with one embodiment of the present invention.

FIG. 1 is a block diagram of exemplary delay measuring system 100 in accordance with one embodiment of the present invention. Delay measuring system 100 includes a first transition stage 110, a second transition stage 120, and a transition completion detection component 130. In one embodiment, the first transition stage 110 and the second transition stage 120 are parallel to one another and included in a ring configuration with the transition completion detection component 130. The first transition stage 110 includes a first component under test 111 and the first transition stage is operable to cause at least one inversion transition. The second transition stage 120 includes a second component under test 121 and the second transition stage is operable to cause at least one inversion transition. The transition completion detection component 130 is coupled to the first component under test 111 and the second component under test 121. The transition completion detection component is operable to detect an indication of the amount of delay time from initiating an inversion transition to completing the inversion transition. It is appreciated components of exemplary delay measuring system 100 can include a variety of different configurations. Additional different exemplary delay measuring system configurations and components are described in later sections of the present description.

Figure 2:
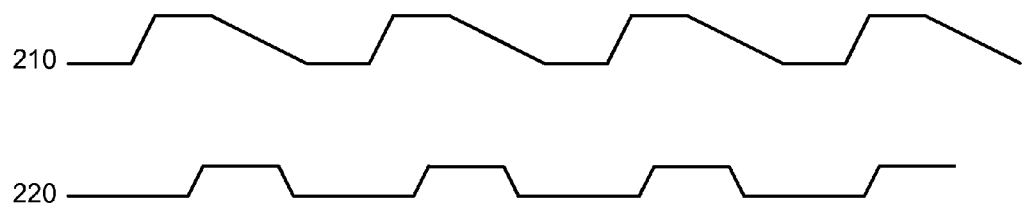
FIG. 2 is a block diagram of an exemplary timing diagram of a count of slow falling transitions in accordance with one embodiment of the present invention.

The indication of the amount of delay time can be based upon the output of the transition completion detection device and can be directed to one aspect (e.g., pull up versus pull down, rising transition versus falling transition, etc.) of an asymmetric delay. In one embodiment, the indication of a transition delay can isolate delays associated with transitions in one direction (e.g., pull up, rising, etc.) from delays associated with transitions in another direction (e.g., pull down, falling, etc.), or vice versa. FIG. 2 is a block diagram of an exemplary timing diagram of a count of slow falling transitions in accordance with one embodiment of the present invention. The rising edges of the count signal 220 are associated with the slow falling transitions of the transition completion detection device output signal 210. The count of the slow falling transitions can be utilized to determine a slow falling transition delay time or time to complete the slow falling transition. It is appreciated that isolated indication or measurement of a transition delay associated with one transition direction can be utilized to refine examination and analysis of characteristics and features associated with the components under test. Additional description of examination and analysis of characteristics and features associated with the components under test is set forth in later sections.

It is appreciated that a variety of different components can be included in the transition stages and a transition completion detection component. Transitions stage 110 and 120 can include pull up components and pull down components.

A component under test can cause a transition itself or impact (e.g., delay, alter, etc.) a transition from another component. The component under test 111 and component under test 121 can be inverters. An inverter can be a leakage inverter and have a transition delay that is primarily a function of the leakage current. The output of the transition stages can be inverted whether or not the component under test 111 and component under test 121 themselves invert their respective inputs. In one embodiment, the transition stages can include an inverter with a transition delay that is primarily a function of drive current (e.g., saturation current, on current, etc.).

Figure 3:
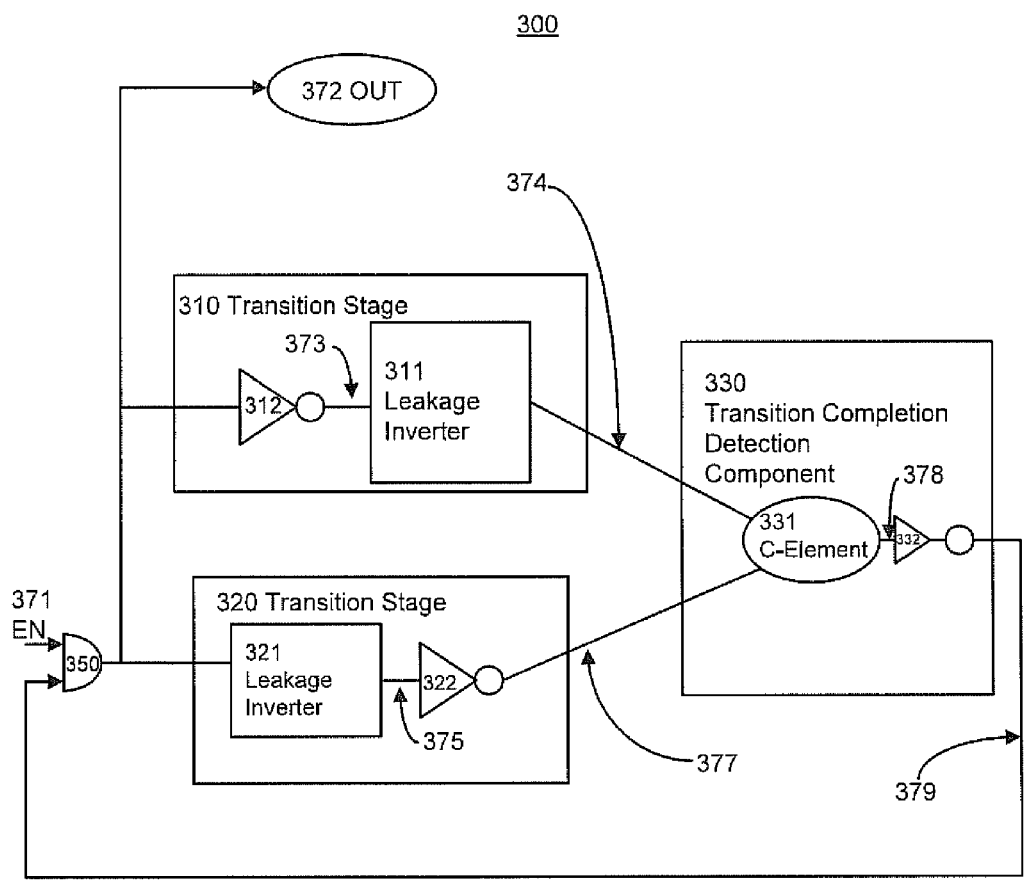
FIG. 3 is a block diagram of an exemplary delay measuring system in accordance with one embodiment of the present invention.

FIG. 3 is a block diagram of exemplary delay measuring system 300 in accordance with one embodiment of the present invention. The components under test in delay measuring system 300 are leakage inverters. Delay measuring system 300 includes first transition stage 310, second transition stage 320, transition completion detection component 330 and control component 350. Transition stage 310 includes leakage inverter 311 and driven inverter 312. Transition stage 320 includes leakage inverter 321 and driven inverter 322. Transition completion detection component 330 includes C-Element 331 and driven inverter 332.

In one embodiment, leakage inverters 311 and 321 are configured to transition a signal, wherein a leakage current impacts a transition of the signal. In one exemplary implementation, the leakage current characteristic impacts a transition delay (e.g., a delay from beginning a transition to completing the transition, etc.). The impact can include delaying the transition. The leakage current characteristic can impact the rising or pull up transition delay or the falling of pull down transition delay. Leakage inverters can be similar to leakage inversion components and systems described in co-pending Application entitled A SYSTEM AND METHOD FOR EXAMINING LEAKAGE IMPACTS (application Ser. No. 13/287,044), incorporated herein by reference.

Figure 4:
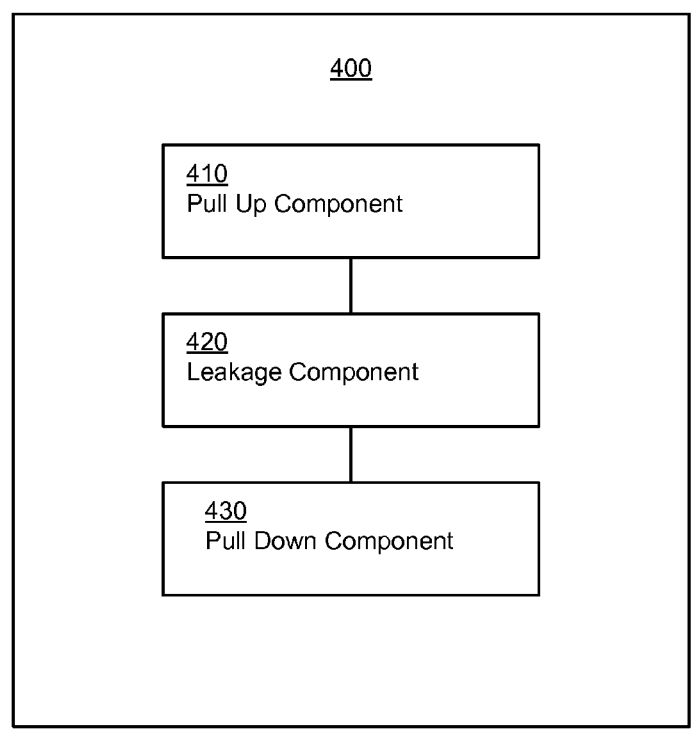
FIG. 4 is a block diagram of an exemplary leakage inverter in accordance with one embodiment of the present invention.
Figure 4:
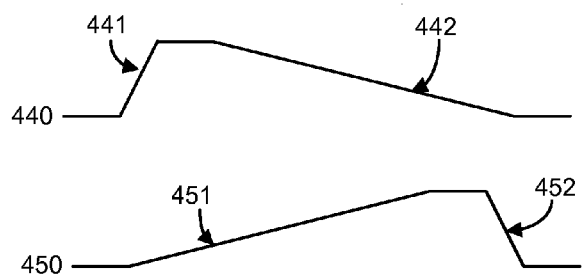

FIG. 4 is a block diagram of an exemplary leakage inverter 400 in accordance with one embodiment of the present invention. Leakage inverter 400 comprises a pull up component 410, leakage component 420 and pull down component 430. In one exemplary implementation, leakage component 420 is coupled in series between the pull up component 410 and the pull down component 420. The components of leakage inverter 400 cooperatively operate to pull up and pull down a signal. In one embodiment, pull up component 410 is configurable to perform a pull up operation to pull up a signal, pull down component 420 is configurable to perform a pull down operation to pull down the signal; and a leakage in leakage component 430 impacts at least one transition of the signal.

In one embodiment, a transition delay associated with the pull down operation is asymmetric with respect to transition delay associated with the pull up operation and the asymmetry is associated with an effect of the leakage current on at least one transition of the signal. In one exemplary implementation, transitions of the signal are represented by graph 440 with a relatively fast rising transition delay 441 and a relatively slow transition delay 442. In one exemplary implementation, the transitions of the signal are represented by graph 450 with a relatively slow rising transition delay 451 and a relatively fast transition delay 452. It is appreciated that pull up component 410, leakage component 420 and pull down component 430 can include a variety of components. In one embodiment, the leakage component includes a transistor in the off state that gradually allows leakage current to flow. In one exemplary implementation, the leakage current is strong or large enough to overpower at least one of the pull up or pull down components.

Figure 5:
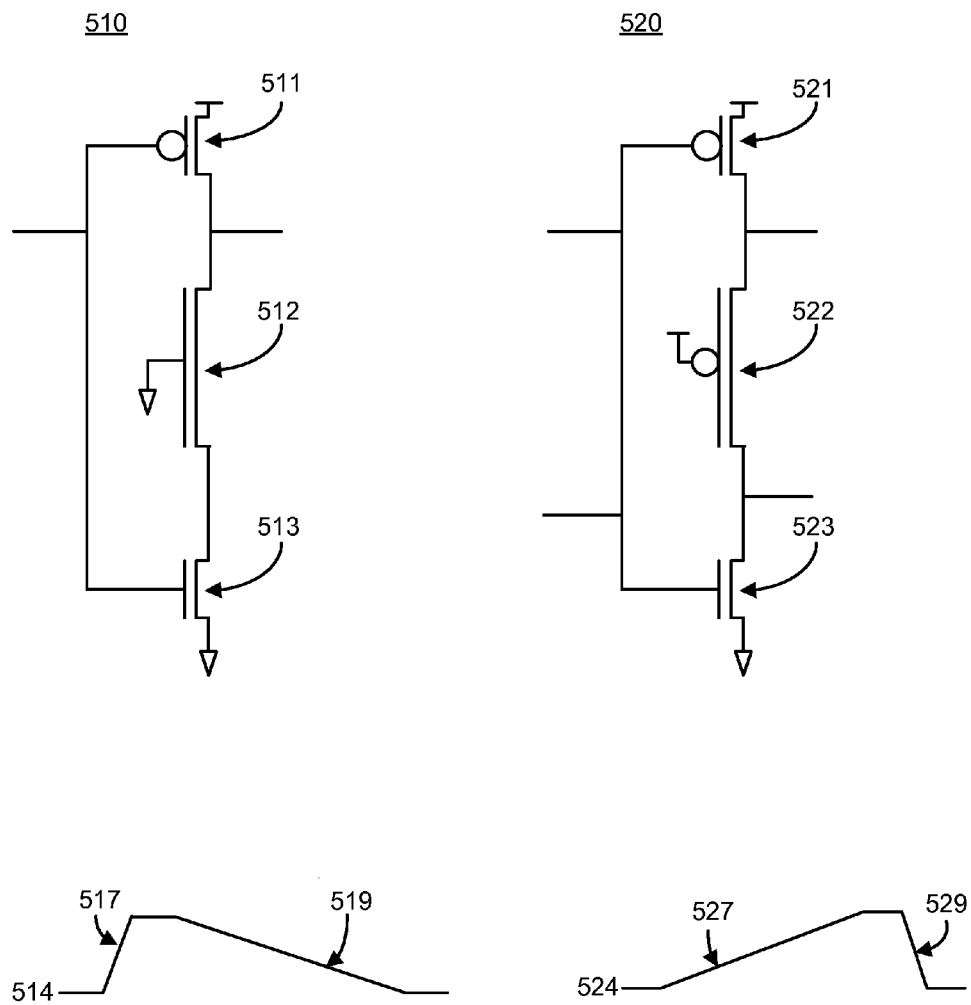
FIG. 5 is a block diagram of exemplary leakage inverters with MOS components in accordance with some embodiments of the present invention.

FIG. 5 is a block diagram of exemplary leakage inverters with MOS components in accordance with some embodiments of the present invention. It is appreciated there are a variety of other leakage inverter configurations. Leakage inverter 510 includes a NMOS leakage transistor and leakage inverter 520 includes a PMOS leakage transistor.

Leakage inverter 510 includes pull up component PMOS transistor 511, leakage component NMOS leakage transistor 512 and pull down component NMOS transistor 513. In one exemplary implementation, the incoming signal is low and pull down component NMOS transistor 513 turns off, pull up component PMOS transistor 511 turns on to perform a pull up operation and leakage component NMOS transistor 512 does not impact an output signal transition to a pulled up value. In one exemplary implementation, the incoming signal is high and pull up component PMOS transistor 511 turns off, pull down component NMOS transistor 513 turns on to perform a pull down operation but leakage component NMOS transistor 512 impacts the output signal transition. As leakage component NMOS transistor 512 is off the pull down transition delay corresponds to a delay for leakage current and corresponding pull down value to "propagate" through the leakage component NMOS transistor 512. In one embodiment, the operations of leakage inverter 510 are represented by graph 514 with a relatively fast rising transition delay 517 and a relatively slow falling transition delay 519.

Leakage inverter 520 includes pull up component PMOS transistor 521, leakage component PMOS leakage transistor 522 and pull down component NMOS transistor 523. In one exemplary implementation, the incoming signal is high and pull up component PMOS transistor 521 turns off, pull down component NMOS transistor 523 turns on to perform a pull down operation and leakage component PMOS transistor 522 does not impact an output signal transition to a pulled down value. In one exemplary implementation, the incoming signal is low and pull down component NMOS transistor 523 turns off, pull up component PMOS transistor 521 turns on to perform a pull up operation but leakage component PMOS transistor 522 impacts the output signal transition. As leakage component PMOS transistor 522 is off the pull down transition delay corresponds to a delay for leakage current and corresponding pull up value to "propagate" through the leakage component PMOS transistor 522. In one embodiment, the operations of leakage inverter 520 are represented by graph 524 with a relatively slow rising transition delay 527 and a relatively fast falling transition delay 529.

With reference back to FIG. 3, in one embodiment, the C-Element 331 is operable to detect completions of a first type of transition (e.g., pull up, rising, etc.) distinct or isolated from completions of a second type of transition (e.g., pull down, falling, etc.). In one exemplary implementation, the C-Element component 331 has a plurality of inputs and is operable to output a first value if the value of the plurality of inputs match the first value and the C-Element component continues to output the first value until the plurality of inputs equal a second value, and in response to sensing the plurality of inputs equal a second value the C-Element component 331 is operable to output the second value.

Figure 6:
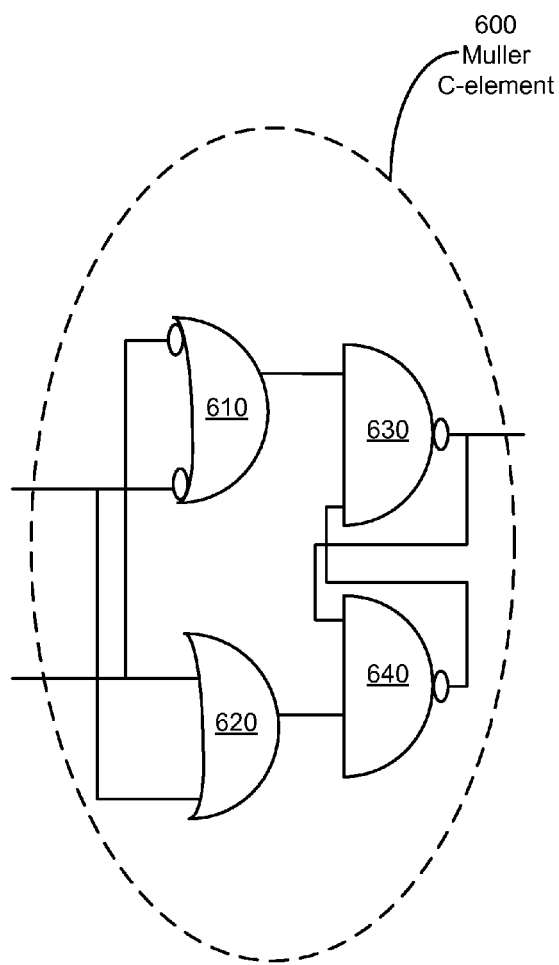
FIG. 6 is a block diagram of an exemplary Muller C-Element in accordance with one embodiment of the present invention.

FIG. 6 is a block diagram of an exemplary Muller C-Element 600 in accordance with one embodiment. Muller C-Element 600 includes NAND logic components 630 and 640, OR logic gates 610 and 620. The inputs to OR logic gate 610 are inverted. Muller C-Element 600 has two inputs and one output. Muller C-Element 600 is operable: to output a logical 0 if the two inputs are both a logical 0 and continue to output a logical 0 until the two inputs are a logical 1; to output a logical 1 if the two inputs are both a logical 1 and continue to output a logical 1 until the two inputs are a logical 0. The output does not change if: both inputs are a logical 0 and only one of the inputs changes to a logical 1; or both inputs are a logical 1 and only one of the inputs changes to a logical 0.

Figure 7:
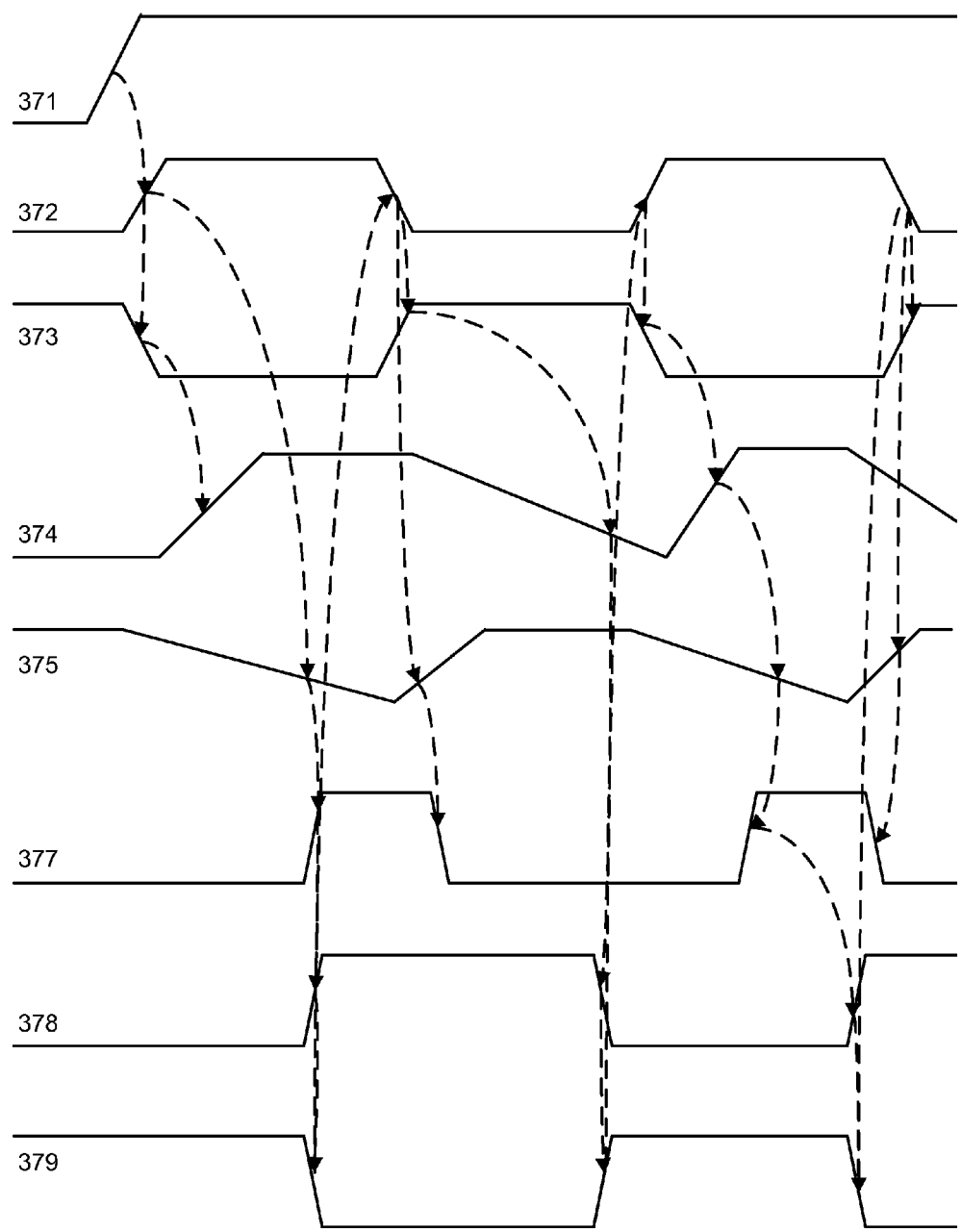
FIG. 7 is a block diagram of an exemplary timing graph in accordance with one embodiment of the present invention.

FIG. 7 is a block diagram of exemplary timing graph 700 in accordance with one embodiment of the present invention. Timing graph 700 corresponds to one exemplary implementation of delay measuring system 300 and illustrates respective signal transitions at points 371, 372, 373, 374, 375, 377, 378 and 379.

Figure 8:
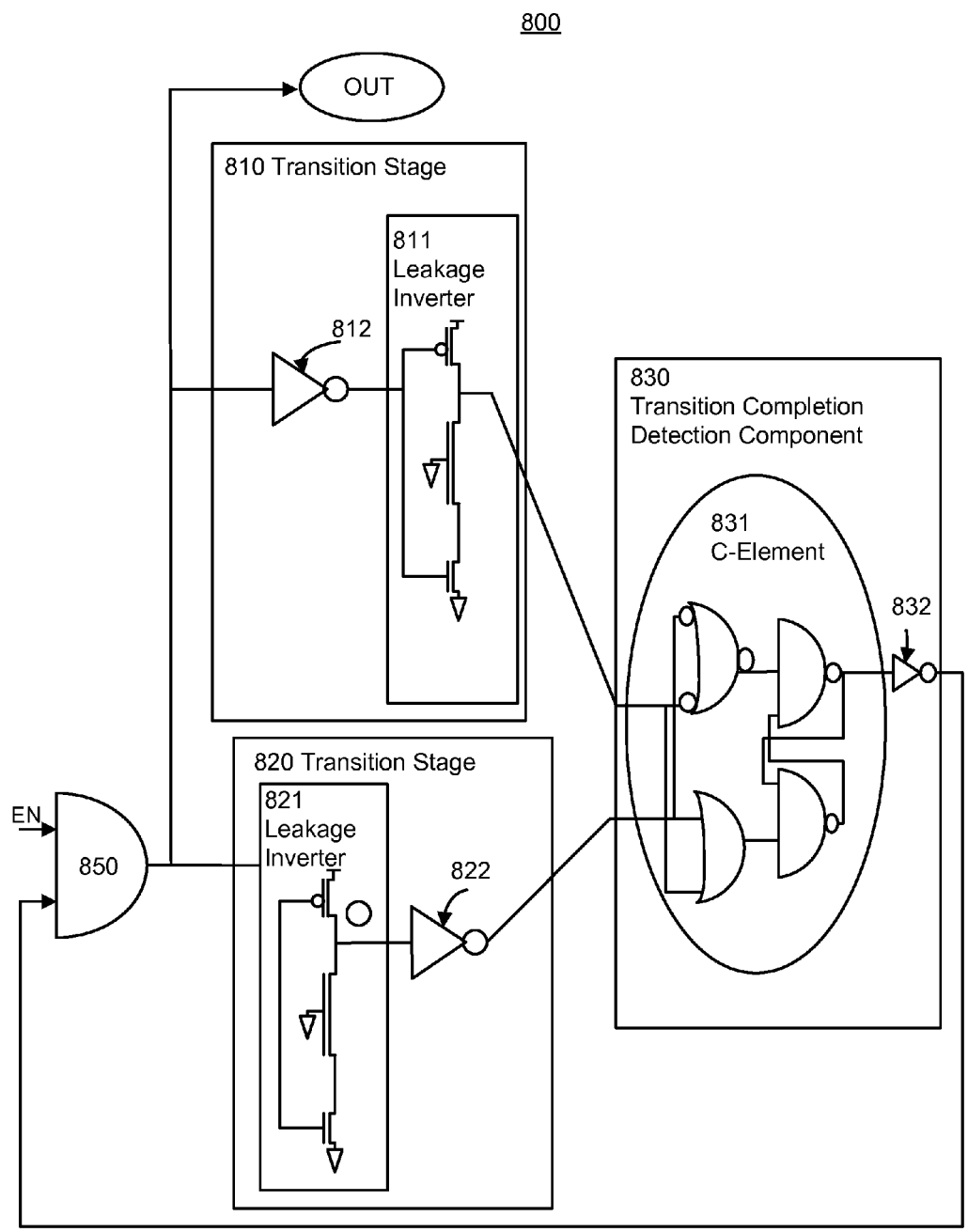
FIG. 8 is a block diagram of an exemplary delay measuring system in accordance with one embodiment of the present invention.

FIG. 8 is a block diagram of exemplary delay measuring system 800 in accordance with one embodiment of the present invention. The components of delay measuring system 800 are similar to an embodiment of delay measuring system 300 when NMOS leakage inverters are the components under test. Delay measuring system 800 includes first transition stage 810, second transition stage 820, transition completion detection component 830 and control component 850. Transition stage 810 includes leakage inverter 811 and driven inverter 812. Transition stage 820 includes leakage inverter 821 and driven inverter 822. Transition completion detection component 830 includes C-Element 831 and driven inverter 832. In one embodiment, leakage inverter 811 and leakage inverter 821 include NMOS leakage inverters similar to NMOS leakage inverter 210 and C-Element 831 includes a C-Element similar to C-Element 700.

Figure 9:
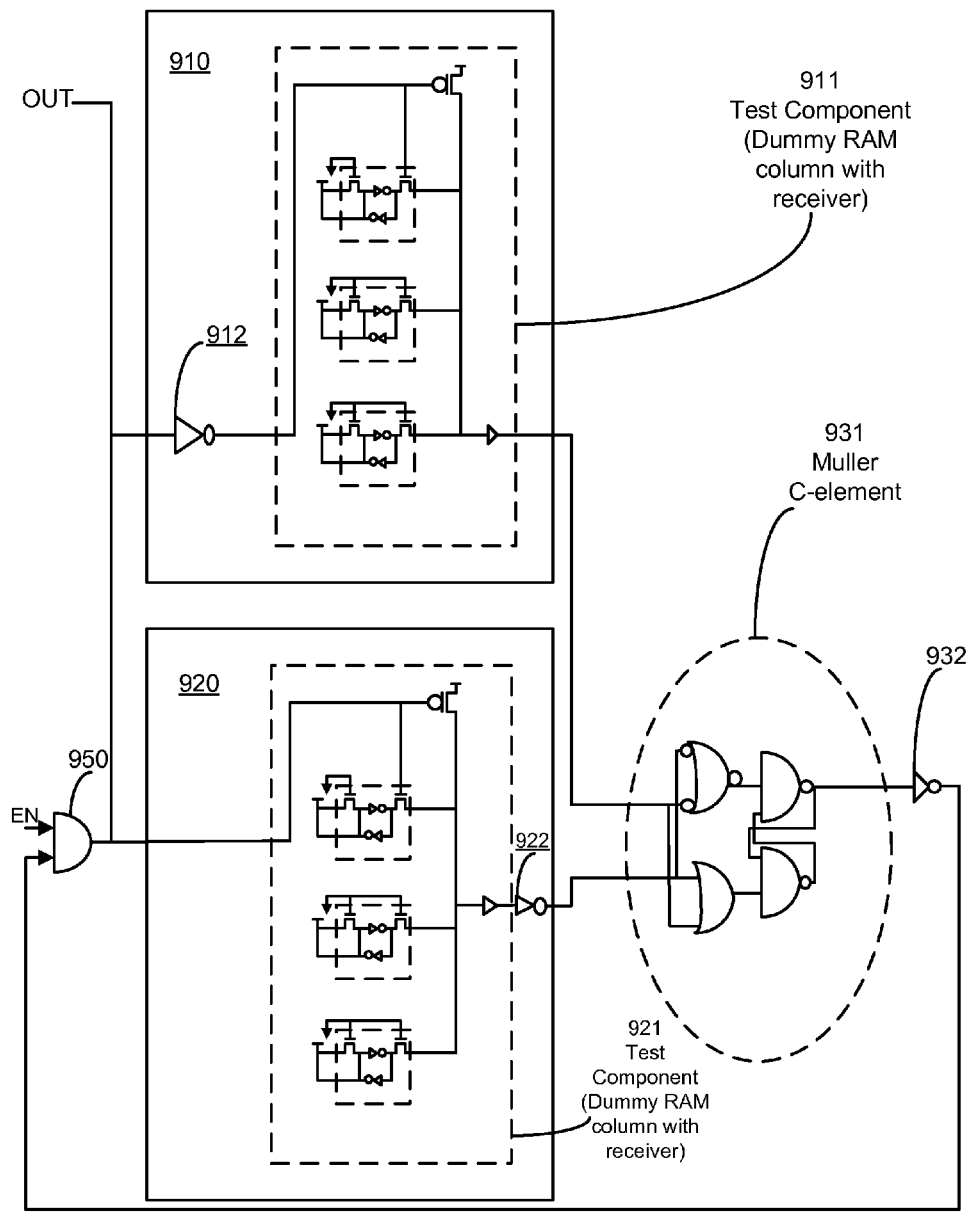
FIG. 9 is a block diagram of an exemplary delay measuring system in accordance with one embodiment of the present invention.

FIG. 9 is a block diagram of exemplary delay measuring system 900 in accordance with one embodiment of the present invention. Delay measuring system 900 includes memory cells as the devices under test. Delay measuring system 900 includes first transition stage 910, second transition stage 920, transition completion detection component 930 and control component 850. Transition stage 910 includes dummy random access memory (RAM) column with receiver in test component 911 and driven inverter 912. Transition stage 820 includes dummy RAM column with receiver in test component 921 and driven inverter 922. Transition completion detection component 930 includes C-Element 931 and driven inverter 932.

In one embodiment, the dummy RAM column with receiver in test components 911 and 912 do not invert the output themselves but rather introduce a delay to the respective inversion transitions at the output from transition stages. In one exemplary implementation the driven inverters 912 and 922 invert the signal and dummy RAM column with receiver in test components 911 and 912 cause a delay to the transition of the signal at the output of the transition stages 910 and 920 with respect to the signal state at the input of transition stages 910 and 920. It is appreciated that the delay introduced by the dummy RAM column with receiver can correspond to the phase of a memory operation. In one embodiment, delays introduced by the dummy RAM column with receiver correspond to a bit line pre-charge phase and a read phase. In one exemplary implementation, delays introduced by different phases of the dummy RAM column with receiver are asymmetric with respect to one another. A pre-charge phase can introduce a long or slow delay and the read phase can introduce a short or fast phase or vice versa.

FIG. 10 is a block diagram of an exemplary delay measuring method 1000 in accordance with one embodiment of the present invention.

In block 1010, a first inversion transition is performed. The first inversion can include a logical state inversion (e.g., pull up, pull down, etc.).

In block 1020, a second inversion transition is performed. In one embodiment, the first inversion transition and second inversion transition have an asymmetric delay characteristic. In one exemplary implementation, the first inversion transition is relatively fast compared to the relatively slow second inversion transition.

In block 1030, a transition completion measurement process associated with the second inversion transition is performed. In one embodiment, the transition completion measurement process measures an indication of the amount of delay time from initiating the second inversion transition to completing the second inversion transition. In one exemplary implementation, the transition completion measurement process can also measure an indication of the amount of delay time from initiating the second inversion transition to completing the second inversion transition. The indication of the amount of delay time can be a count based upon the output of a transition completion detection process.

FIG. 11 is a block diagram of exemplary transition completion detection process 1100 in accordance with one embodiment of the present invention. In block 1110, the logical value of two inputs are examined. In block 1120, a logical 0 is output if both of the two inputs are a logical 0 and the logical 0 continues to be output until both inputs are a logical 1. In block 1130, a logical 1 is output if both of the two inputs are a logical 1 and the logical 1 continues to be output until both inputs are a logical 0. In one embodiment of completion detection process 1100, the output does not change logical state if one input is a logical 1 and the other input is a logical 0.

FIG. 12 is a flow chart of exemplary analysis method 1200 in accordance with one embodiment of the present invention.

In block 1210, an inversion process is performed. In one embodiment, the inversion process includes pull ups and pull downs. The inversion process can include transitions between a logical 1 state and a logical 0 state. The inversion process can include introduction of a delay in an output of the inversion transition. The delay can be asymmetric with respect to the direction of the transition (e.g., fast rising transition versus slow falling transition, slow pull up transition versus fast pull down transition, vise versa, etc.).

In block 1220, an analysis process is performed based upon a delay associated with the inversion process. It is appreciated that a variety of different analyses can be performed. In one embodiment, an indication associated with a time delay is received and a transition delay time is determined. In one exemplary implementation, the transition delay is associated with one aspect (e.g., rinsing versus falling, pull up versus pull sown, etc.) of asymmetric transitions. In one embodiment, characteristics of a device are analyzed based upon the transition delay time. It is appreciated that a variety of characteristics can be analyzed (e.g., manufacturing process compliance and defects, leakage current power consumption, etc.). The device analysis process can include analyzing a fabrication process and operating parameters based upon the amount of delay time.

Figure 13:
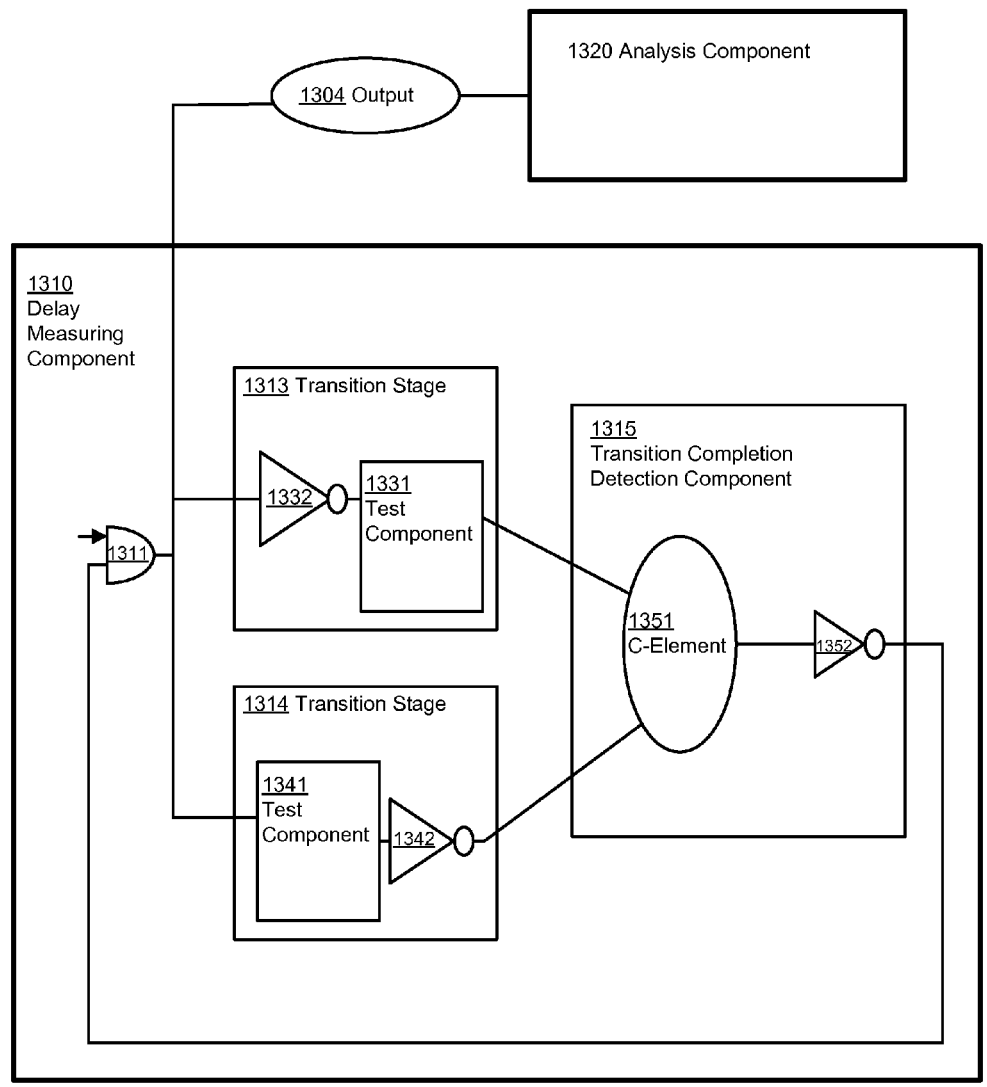
FIG. 13 is a block diagram of exemplary analysis system in accordance with one embodiment of the present invention.

FIG. 13 is a block diagram of exemplary analysis system 1300 in accordance with one embodiment of the present invention. Analysis system 1300 includes delay measuring system 1310 and analysis component 1320. Delay measuring system 1310 includes a first transition stage 1313, a second transition stage 1314, a transition completion detection component 1350 and control component 1311. The first transition stage 1131 includes a first component under test 1331 and driven inverter 1332. The second transition stage 1314 includes a second component under test 1341 and driven inverter 1342. Transition completion detection component 1315 includes c-element 1351 and driven inverter 1352. The components of delay measuring system 1310 are similar to components of delay measuring system 100. Analysis component 1320 performs analysis based upon the output 1304 from delay measuring system 1310. In one embodiment analysis component 1320 performs an analysis process similar to an analysis process of block 1220.

In one embodiment, while an indication of leakage current is measured an analysis is directed to other aspects beyond leakage current. In one exemplary implementation, really more concerned with a related but different characteristic. The concern or examination can be directed to what the static power consumption of the device is. It is appreciated there is a lot of analysis that can be done while examining the delay in the frequency. In one embodiment, component configurations and operations are simulated in spice and then compared to the measured result with present systems. If the physical implementation is running faster than the simulated version then there is an indication the leakage is higher than expected. In one embodiment, the difference between the PMOS and NMOS leakage is analyzed. This is similar to asymmetric situations. One thing that was previously extremely challenging in terms of ring oscillator is how to figure out how much of a characteristic (e.g., delay, power consumption, etc.) is associated with or attributable to NMOS components and how much is associated with or attributable to PMOS components.

It is appreciated that present systems and methods can be implemented in a variety of situations or environments. Present systems and methods can facilitate confirmation of chip compliance with design specifications and detection of manufacturing process irregularities. Present systems and methods can facilitate examination and analysis of asymmetric characteristics. The output of present systems can include a waveform that is acceptable to a counter. In one embodiment, there is a 50% duty cycle output similar to a clock, with frequency and duty cycle both determined by a slow transition, which can be used to drive a counter. It one embodiment, a frequency and duty cycle can be determined by a fast transition. In one exemplary implementation, the present operation examination approaches facilitate utilization of relatively small ring oscillations with asymmetric delay devices that achieve proper polarities. The present approaches can also allow for measurement and analysis components (e.g., components of systems 100, 300, 800, 1300, etc.) to be selectively turned on and off facilitating further conservation of power consumption. The present approaches facilitate more monitoring structures to be instantiated than conventional attempts and at a lower area cost. The present approaches also facilitate closer monitoring of process and operating parameters.

Portions of the detailed description are presented and discussed in terms of a method. Although steps and sequencing thereof are disclosed in figures herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed within a computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "processing", "computing", "calculating", "determining", "displaying", "accessing," "writing," "including," "storing," "transmitting," "traversing," "associating," "identifying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Some embodiments may be described in the general context of computer-executable instructions, such as program modules, executed by one or more computers or other devices. Generally, program modules include routines, programs, objects, components, data structures, etc., that perform particular tasks or implement particular abstract data types. Typically the functionality of the program modules may be combined or distributed as desired in various embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A delay measuring system comprising:
   a first transition stage including a first component under test, the first transition stage operable to cause a first inversion transition in a signal;
   a second transition stage including a second component under test, the second transition stage operable to cause a second inversion transition in the signal, wherein an amount of time to complete the first inversion transition is different from an amount of time to complete the second inversion transition; and
   a transition completion detection component coupled to the first component under test and the second component under test, wherein the transition completion detection component is operable to detect an indication of a delay measurement between initiating the second inversion transition to completing the second inversion transition.

2. The delay measuring system of claim 1 wherein the first component under test, the second component under test and the transition completion detection component are included in a ring oscillator configuration.

3. The delay measuring system of claim 1 in which the first inversion transition is a pull up transition and the second inversion transition is a pull down transition.

4. The delay measuring system of claim 1 in which the first transition stage and the second transition stage each include a leakage inverter.

5. The delay measuring system of claim 1 in which the first transition stage and the second transition stage each include a dummy random access memory (RAM) column with receiver.

6. The delay measuring system of claim 1 wherein the transition completion detection device has two inputs and is operable:
   to output a logical 0 if the two inputs are both a logical 0 and continue to output a logical 0 until the two inputs are a logical 1;
   to output a logical 1 if the two inputs are both a logical 1 and continue to output a logical 1 until the two inputs are a logical 0; and
   the output of the does not change if:
      both inputs are a logical 0 and only one of the inputs changes to a logical 1; or
      both inputs are a logical 1 and only one of the inputs changes to a logical 0.

7. The delay measuring system of claim 1 wherein the transition completion detection device is a C-Element device.

8. The delay measuring system of claim 1 in which the indication of the amount of delay time is a count based upon the output of the transition completion detection device.

9. The delay measuring system of claim 1 in which the first inversion transition and the second inversion transition have asymmetric delay times.

10. The delay measuring system of claim 1 in which the asymmetric transitions include fast asymmetric transitions that complete a transition between the first state and the second state faster than slower asymmetric transitions between the second state and the first state.

11. A delay measuring method comprising;
    performing a first inversion transition in a signal;
    performing a second inversion transition in the signal;
       wherein the first inversion transition and second inversion transition have an asymmetric delay characteristic; and
    performing a transition completion measurement process associated with the second inversion transition, wherein the transition completion measurement process measures an indication of the amount of delay time from initiating the second inversion transition to completing the second inversion transition.

12. The delay measuring method claim 11 in which the first inversion transition is relatively fast compared to the relatively slow second inversion transition.

13. The delay measuring method claim 11 in which indication of the amount of delay time is a count based upon the output of a transition completion detection process.

14. The delay measuring method claim 11 wherein the transition completion detection process includes
    examining the logical value of two inputs outputting a logical 0 if both of the two inputs are a logical 0 and continuing to output the logical 0 until both inputs are a logical 1; and outputting a logical 1 if both of the two inputs are a logical 1 and continuing to output the logical 1 until both inputs are a logical 0.

15. The delay measuring method claim 11 further comprising determining an amount of delay time from initiating the second inversion transition to completing the second inversion transition based upon a count of the second inversion transitions.

16. The delay measuring method claim 11 further comprising analyzing a fabrication process and operating parameters based upon the amount of delay time.

17. An operation examination method comprising:
performing a delay measuring process, wherein the delay measuring process includes an indication of a delay associated with oscillating asymmetric transitions in a signal between a first state and a second state; and
performing an analysis process based upon a delay associated with the inversion process.

18. An operation examination method of claim 17, wherein the delay is associated with one aspect of asymmetric transitions.

19. An operation examination method of claim 17 wherein the analysis process includes examination of manufacturing process compliance and defects.

20. An operation examination method of claim 17 wherein the analysis process includes examination of operating parameters including leakage current power consumption.

* * * * *